United States Patent
Wolf et al.

(10) Patent No.: US 8,253,424 B2
(45) Date of Patent: Aug. 28, 2012

(54) TOPOLOGY SURVEYING A SERIES OF CAPACITORS

(75) Inventors: -Ing. Henrik Wolf, Kassel (DE); Thomas Wegener, Kassel (DE); Daniel Clemens, Niestetal (DE); Harald Drangmeister, Hünfeld (DE)

(73) Assignee: SMA Solar Technology AG, Niestetal (DE)

( * ) Notice: Subject to any disclaimer, the term of this patent is extended or adjusted under 35 U.S.C. 154(b) by 333 days.

(21) Appl. No.: 12/557,660

(22) Filed: Sep. 11, 2009

(65) Prior Publication Data

US 2011/0062962 A1    Mar. 17, 2011

(51) Int. Cl.
*G01R 31/12* (2006.01)

(52) U.S. Cl. .......................... 324/548; 324/519; 324/522

(58) Field of Classification Search ................ 324/548, 324/519, 522, 525, 537, 750.17, 754.28, 324/549, 665, 672, 686, 76.66
See application file for complete search history.

(56) References Cited

U.S. PATENT DOCUMENTS

| | | | |
|---|---|---|---|
| 3,125,720 A | 3/1964 | Swift | |
| 3,681,672 A | 8/1972 | Strauss | |
| 4,434,401 A * | 2/1984 | York | 324/762.01 |
| 4,689,734 A | 8/1987 | Lang | |
| 4,805,063 A * | 2/1989 | Kataoka et al. | 361/16 |
| 4,975,796 A | 12/1990 | MacDougall | |
| 5,051,936 A * | 9/1991 | Gleason et al. | 716/116 |
| 5,510,944 A | 4/1996 | Mozar et al. | |
| 5,771,163 A * | 6/1998 | Moriguchi et al. | 363/71 |
| 6,031,738 A | 2/2000 | Lipo et al. | |
| 7,084,638 B1 * | 8/2006 | Kramer et al. | 324/548 |
| 2005/0280968 A1 | 12/2005 | Grundmann | |
| 2006/0087800 A1 * | 4/2006 | Savage | 361/601 |
| 2007/0291522 A1 * | 12/2007 | Toba et al. | 363/132 |
| 2010/0085667 A1 | 4/2010 | Hallak et al. | |

FOREIGN PATENT DOCUMENTS

| | | | |
|---|---|---|---|
| DE | 2 252 434 | A1 | 5/1974 |
| DE | 37 10 799 | A1 | 11/1987 |
| DE | 37 27 025 | A1 | 2/1989 |
| DE | 196 51 726 | A1 | 6/1998 |
| DE | 100 41 340 | A1 | 3/2002 |

(Continued)

OTHER PUBLICATIONS

International Search Report and Written Opinion for co-pending, related PCT Application No. PCT/EP2010/062849, mailed Dec. 28, 2010.

(Continued)

*Primary Examiner* — Roberto Velez
*Assistant Examiner* — Temilade S Rhodes-Vivour
(74) *Attorney, Agent, or Firm* — Thomas, Kayden, Horstemeyer & Risley, LLP

(57) ABSTRACT

A topology for surveying the integrity of a plurality of capacitors connected in series between a pair of bus lines arranged to be connected to a DC-power source comprises a plurality of resistors connected in series between the pair of bus lines, the plurality of resistors being connected in parallel to the plurality of capacitors; and a comparator comparing the electric potential of an intermediate point between two capacitors of the plurality of capacitors with the electric potential of an intermediate point between two resistors of the plurality of resistors. The comparator provides a signal signaling a difference between these two electric potentials, which indicates a loss of integrity of one capacitor of the plurality of capacitors.

21 Claims, 4 Drawing Sheets

FOREIGN PATENT DOCUMENTS

| | | |
|---|---|---|
| EP | 0 440 245 B1 | 4/1995 |
| EP | 1 463 188 A2 | 9/2004 |
| EP | 1 858 148 A1 | 11/2007 |
| EP | 1 887 672 A1 | 2/2008 |
| GB | 2 047 495 | 11/1980 |
| JP | 55055586 | 4/1980 |
| JP | 6 302474 A | 10/1994 |
| JP | 2000307174 | 11/2000 |
| JP | 2000 350465 A | 12/2000 |
| JP | 2001 136755 A | 5/2001 |
| JP | 2002 335632 A | 11/2002 |
| WO | 2004/010557 A2 | 1/2004 |
| WO | 2008/138699 A2 | 11/2008 |

OTHER PUBLICATIONS

Mohan et al., Power Electronics: Converters, Applications and Design, John Wiley & Sons, 1989, pp. 25-40.

* cited by examiner

TOPOLOGY SURVEYING A SERIES OF CAPACITORS

FIELD OF THE INVENTION

The present disclosure generally relates to surveying the integrity of a plurality of capacitors connected in series between a pair of bus lines designed and arranged to be connected to a DC-power source. More particularly, the present disclosure relates to a topology for surveying the integrity of a plurality of capacitors connected in series between a pair of bus lines designed and arranged to be connected to a DC-power source such as, for example, a photovoltaic panel, a plurality of photovoltaic panels, one or more photovoltaic panels combined with a DC/DC-converter, an electric generator, or an electric generator combined with a DC/DC-converter or a AC/DC-inverter. At their other ends, the bus lines are particularly designed and arranged to be connected to a DC/AC-inverter or a DC/DC-converter at the input end of a DC/AC-inverter for feeding electrical energy from the power source into a power grid. For example, the embodiments of the present disclosure may be used in an inverter device for feeding electric energy from an array of photovoltaic panels into a public power grid.

In the present description, the term "topology" is used to refer to a general construction of an electric circuit. Thus, the term topology may also be replaced by the terms "electric circuit" or "circuitry arrangement".

Further, in the present description, the expression "connected (in series) between a or the pair of bus lines" is used to refer to a connection to the one bus line of the pair of bus lines on the one hand and to the other bus line of the pair of bus lines on the other hand.

BACKGROUND OF THE INVENTION

The plurality of capacitors connected in series between a pair of bus lines of a DC circuit of a topology serves to stabilize and smooth a voltage applied between the bus lines which may otherwise be subject to unwanted dynamic changes due to variable input or output currents. In principle, the electric capacitance between the bus lines required for stabilizing and smoothing the voltage applied between the bus lines may be provided by a single capacitor or even by single capacitors connected in parallel between the bus lines. However, such a single capacitor would then be subjected to the full voltage applied between the bus lines. In modern photovoltaic power plants, this voltage typically ranges from 400 to 600 V but may reach or even exceed 1,000 volts. A single capacitor connected between the bus lines must have a working voltage clearly above the maximum voltage applied between the bus lines. Capacitors with a suitable capacitance and a high working voltage, such as on the order of 1,000 volts and higher, are very expensive. For this reason, it is a usual practice to connect two or more low cost capacitors having a lower working voltage in series to provide the necessary capacitance between the bus lines. Each of these capacitors is only subjected to a fraction of the total voltage applied between the bus lines. If one of these capacitors fails, however, the remaining capacitors are additionally subjected to the fraction of the voltage between the bus lines previously covered by the failing capacitor. Particularly with a low overall number of capacitors connected in series, such as for example only two, the remaining capacitors may thus be subjected to a voltage much higher than their working voltage. As a result, they may also break down so that the full voltage between the bus lines is shortcut by the failing and broken down capacitors.

To avoid applying such an excess voltage to the remaining capacitors of a plurality of capacitors connected in series between the bus lines from a failing capacitor of the series, the integrity of the plurality of capacitors has to be surveyed continuously.

US Patent Application Publication 2007/0291522 A1 discloses an interconnection inverter device in which the voltages dropping over each of two capacitors connected in series between two bus lines leading to the inverter are monitored. A controller controls opening or closing of an opening/closing unit connected to either one of the bus lines based on the monitored voltages. If a short-circuit fault occurs in one of the capacitors, a high voltage between the two bus lines is prevented from being applied to the remaining capacitor in that the one bus line in which the opening/closing unit is connected is interrupted towards the DC-power source, i.e., in that one end of the plurality of capacitors is disconnected from the DC-power source.

According to US 2007/0291522 A1, surveying the integrity of the plurality of capacitors requires great effort. One voltage meter is required for each capacitor. Further, the voltage drop over the capacitors have to be monitored carefully and compared to each other or to the total voltage applied between the bus lines.

EP 1 463 188 A2 discloses a circuitry arrangement for limiting the voltage applied between two bus lines by one or a plurality of photovoltaic panels, which is arranged at the input side of an inverter comprising a buffer capacitance arranged between the two bus lines and feeding electric energy from the photovoltaic panel or the plurality of photovoltaic panels into a public power grid. This circuitry arrangement includes a pulsed switch arranged in one of the bus lines, and a voltage meter measuring the voltage between the two bus lines behind the pulsed switch. By pulsing the switch, the effective voltage between the two bus lines behind the switch can be limited to a smaller value than the output voltage of the photovoltaic panel or photovoltaic panels.

There is a need for a simpler but nevertheless effective device for securely surveying the integrity of a plurality of capacitors connected in series between a pair of bus lines arranged to be connected to a DC-power source.

SUMMARY OF THE INVENTION

The present disclosure provides a topology for surveying the integrity of a plurality of capacitors connected in series between a pair of bus lines designed and arranged to be connected to a DC-power source, the topology comprising: a plurality of resistors connected in series between the pair of bus lines, the plurality of resistors being connected in parallel to the plurality of capacitors; and a comparator comparing the electric potential of an intermediate point between two capacitors of the plurality of capacitors with the electric potential of an intermediate point between two resistors of the plurality of resistors, and providing a signal signaling a difference between these two electric potentials which indicates a loss of integrity of one capacitor of the plurality of capacitors.

In a more detailed aspect, the present disclosure provides a topology for surveying the integrity of a plurality of capacitors connected in series between a pair of bus lines designed and arranged to be connected to a DC-power source, the topology comprising a plurality of resistors connected in series between the pair of bus lines, the plurality of resistors being connected in parallel to the plurality of capacitors; and a comparator comparing the electric potential of an intermediate point between two capacitors of the plurality of capacitors with the electric potential of an intermediate point between two resistors of the plurality of resistors, and providing a signal signaling a difference between these two electric potentials which indicates a loss of integrity of one capacitor of the plurality of capacitors; wherein the signal signals whether a difference between the two electric potentials exceeds a predetermined threshold value; wherein voltages dropping over the capacitors on both sides of the intermediate point between the two capacitors of the plurality of capacitors are defined by means of further resistors connected in parallel to these capacitors; wherein the two total resistances of these further resistors on both sides of the intermediate point between the two capacitors are equal, and the two total resistances of the resistors of the plurality of resistors on both sides of the intermediate point between the two resistors of the plurality of resistors are equal; wherein a voltage limiter is arranged to limit a voltage drop over at least one of the second plurality of resistors, the voltage limiter operating a pulsed switched arranged in one of the bus lines at a point located from the capacitors and resistors towards the DC-power source; and wherein the signal operates a switch due to the difference in electric potential exceeding the threshold value, the switch being arranged in parallel to a resistor of a second plurality of resistors connected in series between the bus lines and in parallel to the capacitors.

In the topology according to the present disclosure, the additional plurality of resistors connected in parallel to the plurality of capacitors is used as a voltage divider dividing the voltage applied between the two bus lines in the same ratios as it is dropping over the plurality of capacitors as long as all capacitors work properly. As a result, it is possible to survey the proper function of the single capacitors in that the electric potential of an intermediate point between two capacitors of the plurality of capacitors is compared with the electric potential of an intermediate point between two resistors of the plurality of resistors. As long as the ratios of the voltages dropping over the capacitors and over the resistances on both sides of the intermediate points are equal, there is no difference in electrical potential between the intermediate points. Any failure of a capacitor of the pluralities of capacitors, however, will have a strong impact on the ratio of the voltages dropping over the capacitors on both sides of their intermediate point as the voltage dropping over the failing capacitor brakes down. This directly results in a difference in potential between the two intermediate points. The new topology may be implemented using the series of resistors connected in parallel to the capacitors and the comparator.

As small differences in electric potential between the two intermediate points may be due to tolerances in the absolute values of the voltages dropping over the single capacitors and the resistances of the single resistors which may even change with temperature or other environmental conditions without a failure occurring, the comparator preferably provides a signal signaling whether a difference between the two electric potentials exceeds a predetermined threshold value. This threshold value is suitably predetermined in such a way that is in only exceeded with a failure of one of the capacitors.

In a simple embodiment of the new topology the capacitors on both sides of the intermediate point between the two capacitors of the plurality of capacitors are of equal total capacities and of ideal, i.e., infinite, internal resistances, and the resistors on both sides of the intermediate point between the two resistors of the plurality of resistors are of equal total resistances. In a basic embodiment of the present disclosure, there are only two capacitors of equal capacities and of infinite internal resistances, and two resistors of equal resistance connected in series between the two bus lines.

Most actual capacitors, however, display finite internal resistances. Thus, in the preferred embodiments of the present disclosure, the voltages dropping over the capacitors on both sides of the intermediate point between the two capacitors of the plurality of capacitors are defined by means of further resistors connected in parallel to these capacitors. At least one of these further resistors is then connected in parallel to each capacitor, and shortcut by a failure of this capacitor. If a ratio of resistances of these further resistors on both sides of the intermediate point between the two capacitors, and a ratio of resistances of the resistors of the plurality of resistors on both sides of the intermediate point between the two resistors of the plurality of resistors are equal, there is no difference in electrical potential between the intermediate points between the two capacitors of the plurality of capacitors and between the two resistors of the plurality of resistors, even if the ratios differ from 1 to 1. Such a difference may due to a plurality of capacitors of three or more capacitors or to different voltages dropping over the single voltages.

In the present disclosure, the signal provided by the comparator may directly operate a switch when the difference in electric potential exceeds the threshold value. This switch may, for example, be arranged in one of the bus lines at a point located from the capacitors and resistors towards the DC-power source. Such a switch may simply be opened by the signal provided by the comparator and indicating a loss of integrity of one of the capacitors to cut off the connection to the DC-power source which applies the voltage between the bus lines.

In a slightly more sophisticated embodiment of the new topology which, however, allows for further electric energy to be forwarded from the DC-power source via the bus lines despite a failure of one of the capacitors, the switch operated by the signal provided by the comparator, and indicating a failure of a capacitor, is connected in parallel to a resistor of a second plurality of resistors connected in series between the bus lines and in parallel to the capacitors. This second plurality of resistors is used in combination with a voltage limiter arranged to limit a voltage drop at least one resistor of the second plurality of resistors in that the voltage limiter operates a pulsed switch arranged in one of the bus lines at a point located from the capacitors and resistors towards a DC-power source. As long as the switch operated by the signal from the comparator is not operated, the second plurality of resistors divides the voltage between the bus lines according to a first ratio of resistances of its resistors, and the voltage limiter is adjusted in such a way that it limits the voltage drop over the at least one resistor as a fraction of a total maximum voltage between the bus lines which is equal to the fraction of the resistance of the at least one resistor as compared to the overall resistance of the second plurality of resistors. If, for example, the maximum allowable voltage between the two bus lines is 1,000 volt, if the total resistance of the second plurality of resistors is 10 megohm, and if the resistance of the other resistor is 10 kohm, then the limiter limits the voltage drop over the other resistor to 1,000 volt.

In that the signal provided by the comparator and signaling a failure of one of the capacitors, for example, shortcuts one of the resistors of the second plurality of resistors which does not contribute to the limited voltage drop, the total effective resistance of the second plurality of resistors drops. If, for example, the resistance of the shortcut resistor is 4 megohm, the total resistance of the second plurality of resistors in the above example is reduced to 6 megohm. If the limiter then still limits the voltage drop over the at least one resistor to 1,000 volt, the total voltage between the two bus lines is limited to 600 volt which may still be acceptable, if only one of two capacitors connected in series between the two bus lines is working properly.

When the signal provided by the comparator and signaling a failure of one of the capacitors, for another example, opens a switch which previously shortcut one resistor potentially contributing to the limited voltage drop, the total effective resistance of the second plurality of resistors may essentially remain the same, but the voltage drop will be increased. If, for example, the resistance of the no longer shortcut resistor is 6⅔ kohm, the limited voltage in the above example now drops over 16⅔ kohm, i.e., it is increased by a factor of ⅗. If the limiter then still limits the voltage drop to 1,000 volt, the total voltage between the two bus lines is also limited to 600 volt. Operating a switch connected in parallel to a resistor potentially contributing to the limited voltage drop has the advantage that such a switch is only subject to a low voltage as compared to a switch connected in parallel to a resistor not contributing to the limited voltage when the same change in the small limited voltage drop is to be achieved.

The aforesaid embodiments of the new topology do not require any alteration to the limiter as it automatically limits the voltage between the two bus lines to a reduced value, when the signal provided by the comparator and indicating a capacitor failure operates the switch connected in parallel to one resistor of appropriate resistance of the second plurality of resistors. It has to be noted here that the two pluralities of resistors serve different functions and may thus be made of totally different resistors in totally different ratios of resistances.

In a particular embodiment of the new topology, the comparator comparing the electric potentials of the two intermediate points may comprise a light emitting diode (LED) connected to the intermediate points between the two capacitors of the plurality of capacitors and between the two resistors of the plurality of resistors via a current rectifier H-bridge. Thus, the LED will emit light independently of the direction of the difference in electric potential between the two intermediate points, but only if the difference in electric potential exceeds the on-voltage of the LED. Thus, the on-voltage of the LED may define the predetermined threshold value for the difference in the two electric potentials of the two intermediate points. The light emitted by the LED may be used to close a photo-activated switch directly in a so-called opto-coupler.

The current rectifier H-bridge of this embodiment of the topology according to the disclosure may be made in a conventional way of four rectifying diodes. Further, the LED may be connected in series with a Zener-diode oriented in opposite direction to the LED. The Zener-diode defines the threshold value for the difference in electric potential between the two intermediate points at a much higher value than possible by means of the LED on-voltage.

The current through the LED is automatically limited by those resistors of the plurality of resistors through which this current is actually flowing. These resistors will be of relatively high resistances to avoid a high parasitic current flowing through them between the pair of bus lines.

The new topology may particularly be used in an input circuit of a DC/AC-inverter or a DC/DC-converter. The DC/DC-converter may itself be an input circuit of a following DC/AC-inverter. And any of these DC/AC-inverters may be used to feed electric energy from the DC-power source into a power grid, for example.

In a further embodiment of the topology according to the present disclosure, the comparator may comprise a voltage meter measuring the difference in the electric potential between the two intermediate points between the two capacitors of the plurality of capacitors and between the two resistors of the plurality of resistors. Then, the output signal of the voltage meter is the signal of the comparator which signals a difference between the two electric potentials indicating a loss of integrity of one capacitor of the plurality of capacitors when exceeding small values which are only due to tolerances. This signal of the voltage meter can be used by a controller opening the switch arranged in one of the bus lines or connected in parallel to a resistor of the second plurality of resistors as explained above. The controller may also operate a switch in one of the bus lines in such a way known from EP 1 463 188 A2 that the voltage between the two bus lines behind the switch drops to a level acceptable with regard to the present condition of the capacitors. If all capacitors are working properly, the full nominal voltage may be the voltage to which the controller limits the voltage between the bus lines by operating the switch. If one of two capacitors fails, the voltage may be reduced to 60% of the nominal voltage, for example, which is still acceptable with only one capacitor working between the bus lines. Preferably, a further voltage meter is provided for directly measuring the voltage between the two bus lines to provide a further input signal to the controller operating the switch.

As a security measure, the controller of the new topology may be directly powered by the DC-power source, so that it is always powered when it may be necessary to limit the voltage applied by the DC-power source between the bus lines by means of operating the switch.

In the new topology, the switch in the bus line needs not to be connected directly in front of the plurality of capacitors and the plurality of capacitors. Instead, a DC/DC-converter may be provided, for example, between the switch on the one hand and the plurality of capacitors and the plurality of resistors on the other hand.

The DC-power source may be selected from photovoltaic panels, electric generators, photovoltaic panels combined with DC/DC-converters, electric generators combined with DC/DC-converters and electric generators combined with AC/DC-inverters.

The switch arranged in one of the bus lines and opened by the signal from the comparator may be a relay having a relay solenoid biased into its open state so that it may open very quickly in response to excess voltages due to failures of capacitors or other reasons. The relay solenoid may be automatically biased, when the voltage between the bus lines exceeds a lower threshold value, as only then an excess voltage may occur at all. Further, a capacitor, or a transistor, which is switched on during opening of the relay may be arranged in parallel to the relay to avoid the formation of an electric arc between the contacts of the relay. Such a relay may also be opened when an additional current meter measures a current through one of the DC bus lines exceeding a current threshold value. Thus, the relay has multiple security purposes and protects against excess currents, excess voltages between the bus lines and excess voltages over the remaining capacitors after one or more capacitors of a plurality of capacitors in series has failed.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The present disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

Figure 1:
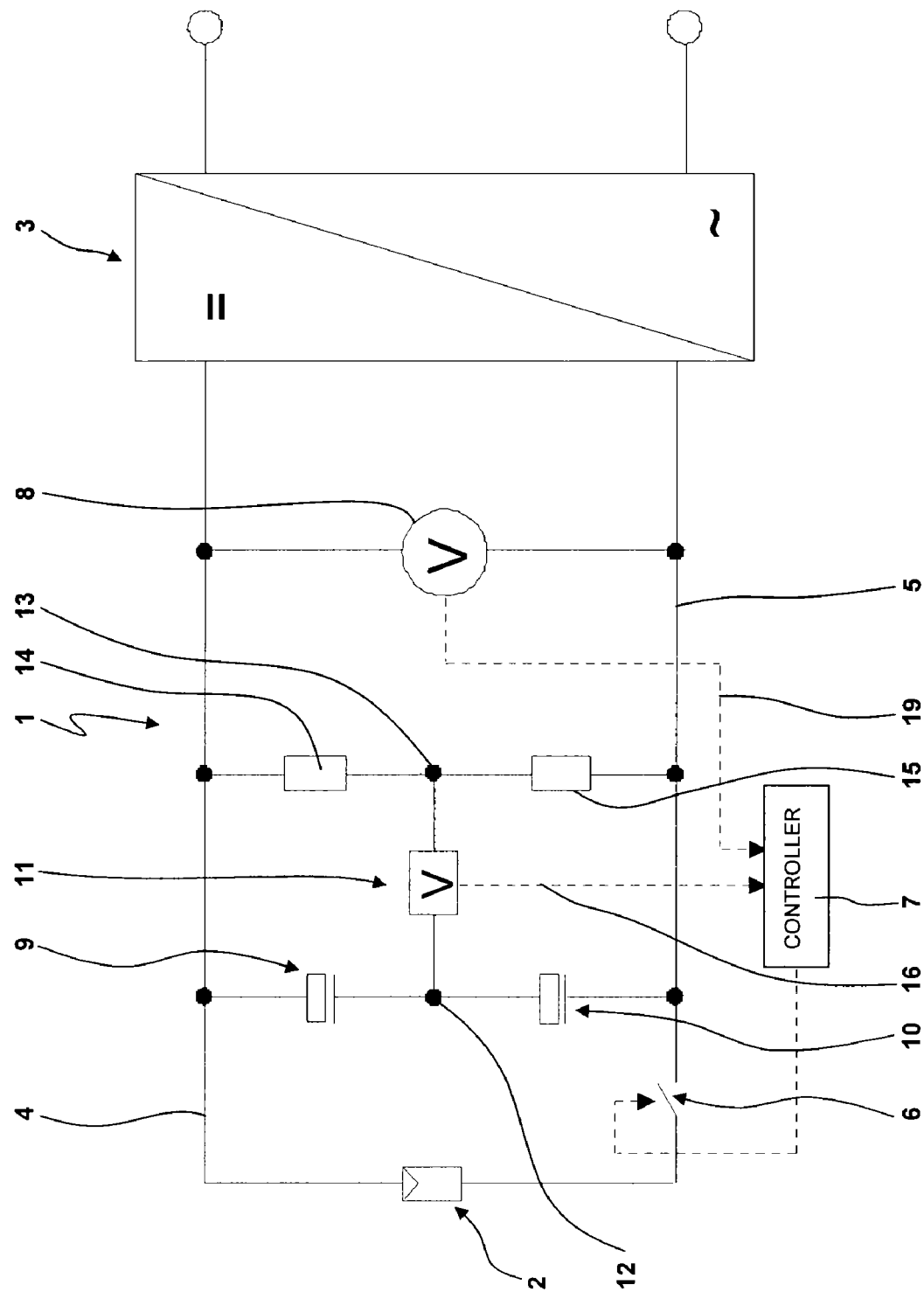
FIG. 1 is a diagram illustrating a first embodiment of the new topology as connected between a photovoltaic panel and an inverter.

Referring now in greater detail to the drawings, FIG. 1 illustrates a topology 1 arranged between a photovoltaic panel 2 and an inverter 3. The inverter 3 may be used for feeding electric energy from the photovoltaic panel 2 into an AC-power grid (not shown). The photovoltaic panel 2 is connected to two bus lines 4 and 5 leading to the inverter 3. A pulsed switch 6 is arranged in the bus line 5 and controlled by a controller 7. The controller 7 defines the ratio of the on-times and the off-times of the pulsed switch 6. During regular use, this is done to limit the voltage between the bus lines 4 and 5 behind the switch 6 to a maximum input value of the inverter 3. The voltage between the bus lines 4 and 5 at the input end of the inverter 3 is measured by a voltage meter 8 providing a voltage signal 9 to the controller 7.

If the voltage measured by the voltage meter 8 exceeds the maximum input voltage of the inverter 3, the on-times of the switch 6 are reduced, which means that the ratio between the on-times and the off-times of the switch decreases. This results in a decrease of the effective voltage between the bus lines 4 and 5, which is buffered by two capacitors 9 and 10 connected in series between the bus lines 4 and 5. The capacitors 9 and 10 provide a buffer capacitance between the bus lines 4 and 5. Two capacitors 9 and 10 are used for providing this buffer capacitance as each of these capacitors 9 and 10 only has to stand one half of the voltage between the bus lines 4 and 5 with the capacitors 9 and 10 connected in series.

However, if one of the capacitors 9 and 10 fails, the other capacitor is subjected to the full voltage between the bus lines 4 and 5. This voltage, even if reduced to the maximum input voltage of the inverter 3, may be much higher than the breakdown voltage of only one of the capacitors 9 and 10, as the breakdown voltage of a capacitors is a cost relevant factor, which is a main reason for using two capacitors 9 and 10 instead of one capacitor of the double breakdown voltage for providing the desired buffer capacitance between the bus lines 4 and 5.

To the end of surveying the integrity of the capacitors 9 and 10, the topology 1 according to FIG. 1 comprises a further voltage meter 11 connected between an intermediate point 12 between the two capacitors 9 and 10 and an intermediate point 13 between two resistors 14 and 15 connected in series between the bus lines 4 and 5, and thus connected in parallel to the two capacitors 9 and 10. Assuming that both capacitors 9 and 10 are exactly of the same capacitance and of infinite or the same internal resistance, and that both resistors 14 and 15 are of the same resistance, and that both capacitors 9 and 10 are working property, the voltage meter 11 should always indicate a difference in electric potential between the intermediate points 12 and 13 of zero. Thus, such a difference in electric potential of zero, or of a small value only deviating from zero due to tolerances of the capacitors 9 and 10 and of the resistors 14 and 15, and signaled to the controller via a signal 16 indicates to the controller that both capacitors 9 and 10 are working properly. Likewise, any voltage measured by the voltage meter 11 and exceeding a value, which is due to tolerances, indicates a failure of one of the components 9, 10, 14 or 15.

The most probable failure will be a failure of one of the capacitors 9 and 10 resulting in that the full voltage between the bus lines 4 and 5 now drops over the remaining capacitor with the risk of a breakdown of this capacitor. To avoid any danger occurring from this situation, the controller may simply permanently open the switch 6 to detach the capacitors 9 and 10 from the photovoltaic panel 2. In a preferred embodiment of the new topology 1, however, the controller 7 still pulses the switch 6, although the signal 16 signals a loss of integrity of one of the capacitors 9 and 10. The switch 6 is then pulsed in a different way with a decreased ratio of on-times to off-times, i.e. with a decreased duty cycle, which reduces the effective voltage between the bus lines 4 and 5 behind the switch 6 to a voltage smaller than the breakdown voltage of the remaining capacitor 9 or 10. The voltage signal 19 of the voltage meter 8 is used for exactly achieving the desired effective voltage between the bus line 4 and 5. Thus, the inverter 3 may further feed electric energy in a power grid or to another load despite one of the capacitors 9 and 10 failing.

If one of the resistors 14 and 15, which are both of very high resistance as they are not intended to guide a working current but only to divide the voltage between the bus lines 4 and 5, fails in the topology 1 according to FIG. 1, the controller handles this situation in the same way as described above and thus avoids any possible damage from this failure. Further, the controller does normally not differentiate between a failure of capacitor 9 or a failure of capacitor 10, i.e., it does normally not differentiate between the direction of the difference in electric potential between the two intermediate points 12 and 13 measured by the voltage meter 11.

Figure 2:
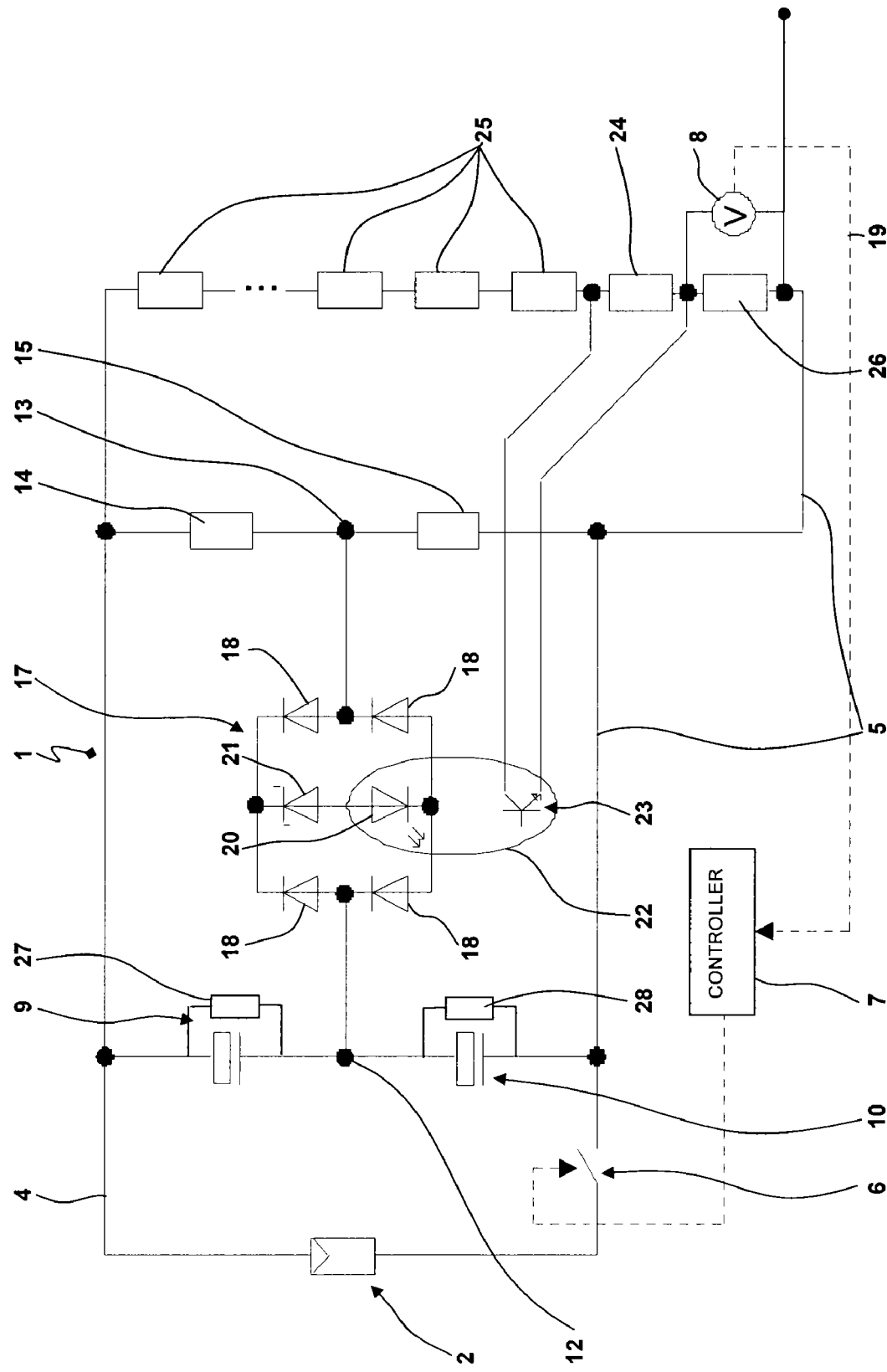
FIG. 2 is a diagram illustrating a second embodiment of the new topology connected to a photovoltaic panel at its input end.

FIG. 2 depicts a variant of the topology 1 without showing the inverter 3 according to FIG. 1. In this variant, there is no further voltage meter 11 between the intermediate points 12 and 13 but a rectifier H-bridge 17 made of four rectifying diodes 18 and providing the rectified current between the intermediate point 12 and 13 to a light emitting diode (LED) 20 connected in series with a Zener-diode 21. The Zener-diode 21 is oriented in the opposite direction to the LED 20 and thus provides for a threshold value to be exceeded by the difference in electric potential between the intermediate points 12 and 13, before the Zener-diode breaks down and lets pass a current to the LED 20. As a result, the LED 20 emits light when the threshold value defined by the Zener-diode 21 is exceeded by the difference in electric potential between the intermediate points 12 and 13 independently of the direction of this difference in electric potential. The current through the LED 20 is limited by that resistor 13 or 15 through which this current is actually flowing. The LED 20 is part of an opto-coupler 22 closing a switch 23, when the light emitting diode 20 emits light.

This switch 23 shortcuts a resistor 24 of a plurality of resistors 24 to 26 connected in series between the bus lines 4 and 5 and in parallel to the resistors 14 and 15. Here, the voltage meter 8 for measuring the voltage between the bus lines 4 and 5 is arranged to only measure the voltage dropping over one resistor 26 belonging to the plurality of resistors 24 to 26. Thus, the voltage meter 8 does not measure the total voltage between the bus lines 4 and 5 but a defined fraction of this total voltage from which the total voltage may be easily calculated, as long as the resistance of the resistor 26 and the total resistance of the plurality of resistors 24 to 26 are fixed. When the switch 23 shortcuts the resistor 24, this results in a reduction of the total resistance of the plurality of resistors of which only the resistors 25 and 26 are still working.

Thus, the voltage meter 8 measures a higher voltage drop over the resistor 26 than before, assuming that the total voltage between the bus lines 4 and 5 is still the same. This effect can be used to get the controller 7 to reduce the voltage 8 dropping over the resistor 26 by means of pulsing the switch 6 to such an extent that the effective voltage between the bus lines 4 and 5 is decreased to such a value acceptable for only one of the capacitors 9 and 10. Thus, this embodiment does without actually notifying to the controller 7 that one of the capacitors 9 and 10 failed. Instead, the voltage signal 19 measured by the voltage meter 8 is manipulated by shortcutting the resistor 24 in such a way that the controller 7 believes that the voltage between the bus lines 4 and 5 is higher than the maximum input voltage of a following inverter, for example. As a result, the controller 7 reduces this effective voltage between the bus lines 4 and 5. If the resistances of the resistors 24 to 26 are selected in an appropriate way, this reduction will be of such an extent that the remaining voltage between the bus lines 4 and 5 will not damage the remaining capacitor 9 or 10.

Further, the embodiment of the topology 1 depicted in FIG. 2 comprises resistors 27 and 28 of a same high resistance which is nevertheless much smaller than the internal resistances of the capacitors 9 and 10. These resistors 27 and 28 distribute the voltage drop between the bus lines 4 and 5 in two identical halves over the capacitors 9 and 10 independently of any tolerances of the capacitors 9 and 10, particularly independently of any differences in the internal resistances of the capacitors 9 and 10. If one of the capacitors 9 and 10 fails, the corresponding resistor 27 or 28, which is connected in parallel to the respective capacitor, is shortcut. The resistors 27 and 28 also allow for the compensation of small dynamic deviations of the electric potential of the intermediate point 12 from the average of the electric potentials of the bus lines 4 and 5, which are not due to failures of the capacitors 9 and 10.

Figure 3:
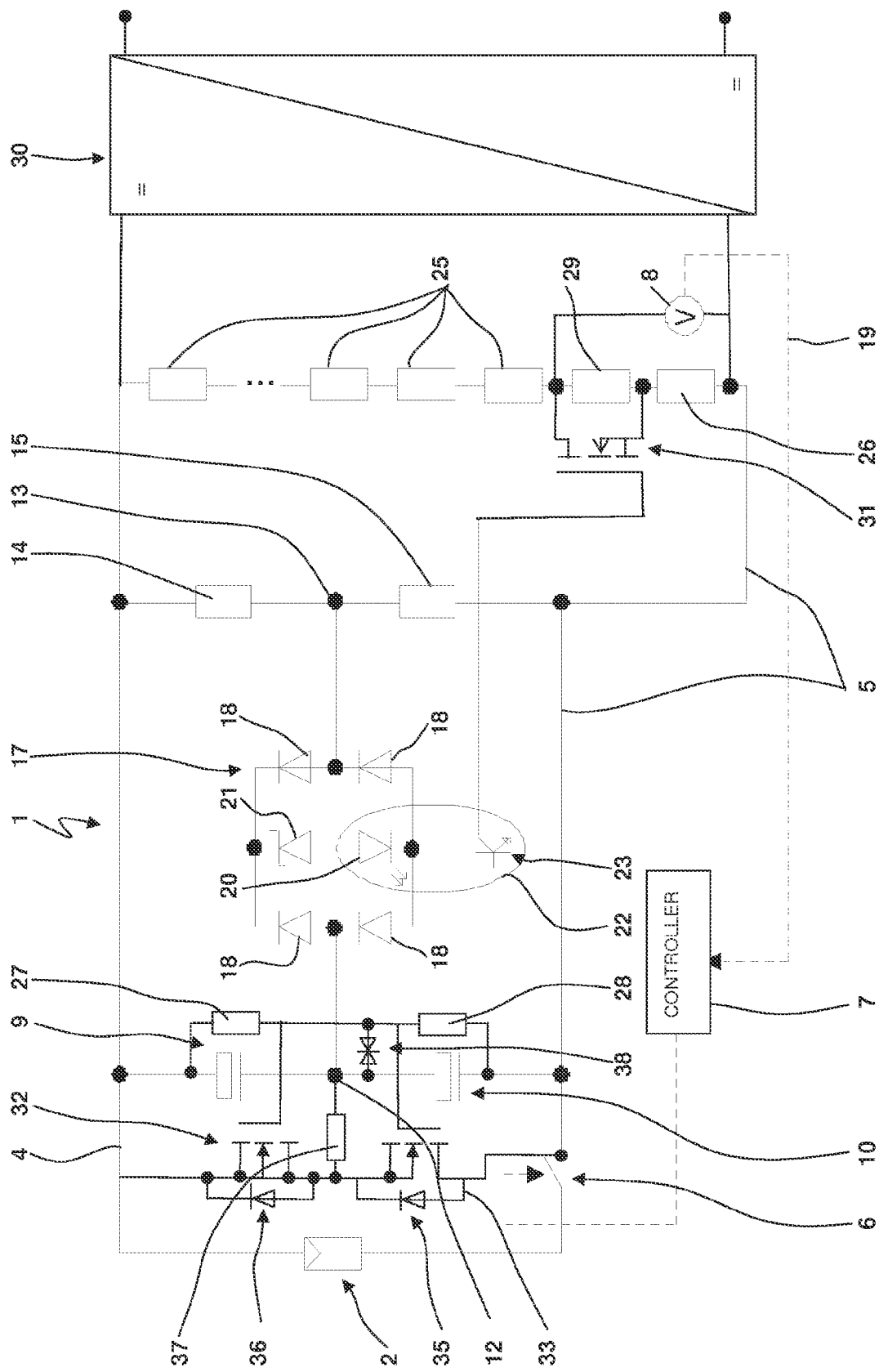
FIG. 3 is a diagram illustrating a third embodiment of the new topology as connected between a photovoltaic panel and an converter.

The embodiment of the topology 1 depicted in FIG. 3 differs from that one in FIG. 2 with regard to the following points. First, a DC/DC-converter 30 is arranged at the output end of the topology. This converter may be the input stage of a further DC/AC-inverter not depicted here. Second, the switch 23 being part of the opto-coupler 22 does not shortcut one of the pluralities of resistors 25, 26 and 29, here, but operates a transistor 31. The transistor 31 is a switch normally shortcutting a resistor 29 which potentially contributes by the voltage drop measured by the voltage meter 8 in the same way as the resistor 26. As long as the resistor 29 is shortcut by the transistor 31, it does not contribute to the voltage drop measured by the voltage meter 8. If the transistor 31, however, is operated via the switch 23 due to a difference in electric potential between the intermediate points 12 and 13, the transistor 31 stops shortcutting the resistor 29. As a result, the voltage drop measured by the voltage meter 8 now comprises contributions by both resistors 26 and 29, i.e., with a constant difference in voltage between the bus lines 4 and 5, It increases to a predetermined extent. Thus, the controller receives a higher voltage signal 19 and reduces the difference in voltage between the bus lines 4 and 5 by a pulsed opening of the switch 6. As an appropriate resistor 29 is of much smaller resistance than an appropriate resistor 24 according to FIG. 2, the switch 23 and the transistor 31 according to FIG. 3 may be kept much simpler than the switch 23 in the embodiment of the topology according to FIG. 2.

Third, the embodiment of the topology 1 according to FIG. 3 comprises a more sophisticated circuitry to distribute the difference in voltage between the bus lines 4 and 5 evenly over the capacitors 9 and 10, in that the electric potential between the resistors 27 and 28 is used to drive two transistors 32 and 33 for adjusting the electric potential of the intermediate point 12 via a current limiting resistor 37. Further, a bidirectional Zener-diode 38 ensures that the gate voltage of the transistors 32 and 33 is limited, particularly if one of the capacitors 9 and 10 fails. With such a failure, the additional circuitry for having a symmetric distribution of the voltage drops over the capacitors 9 and 10 becomes inactive. The transistors 32 and 33 are also protected by diodes 35 and 36, respectively.

Figure 4:
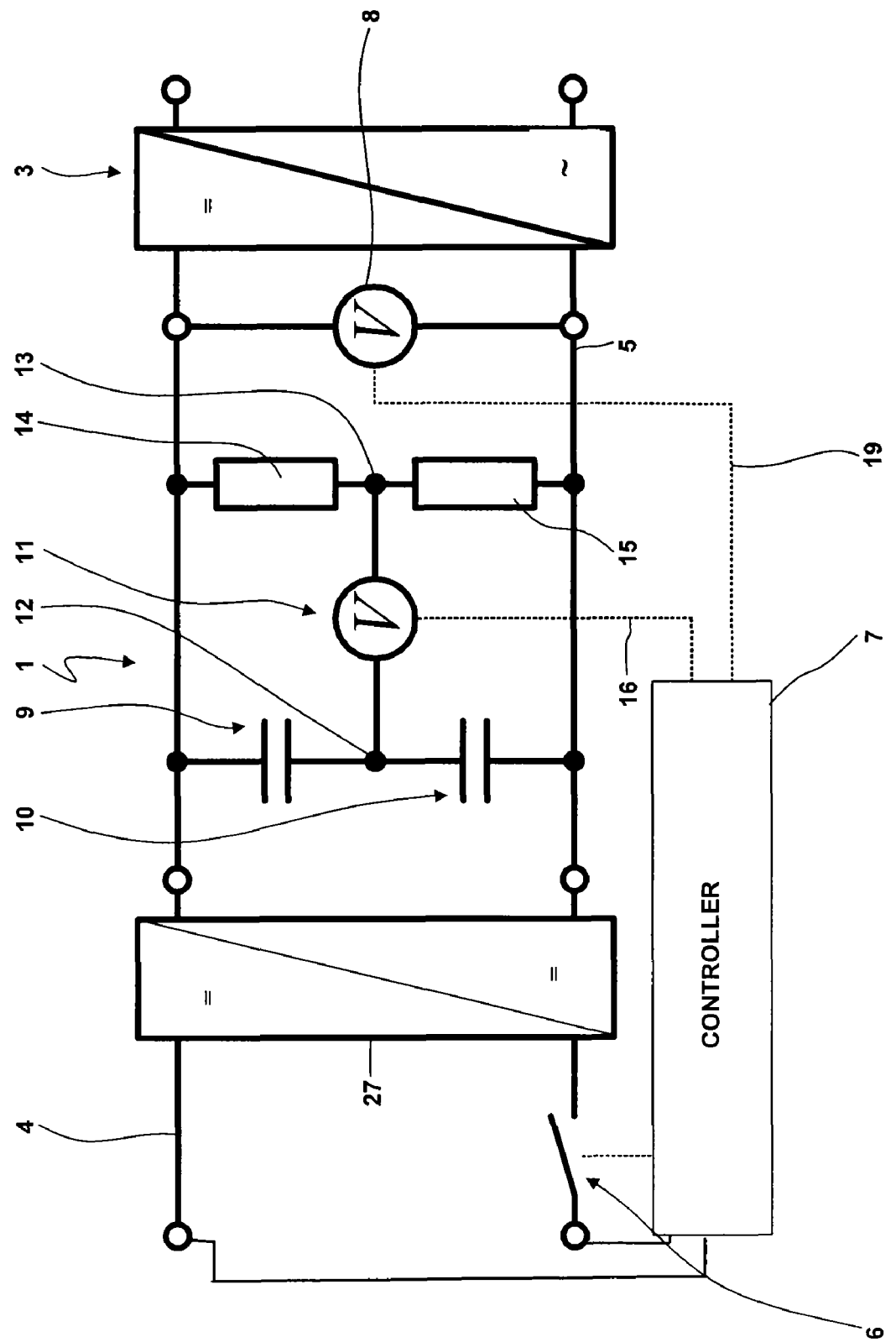
FIG. 4 is a diagram illustrating a forth embodiment of the new topology comprising a DC/DC-converter and connected to an inverter at its output end.

The embodiment of the topology 1 depicted in FIG. 4 is another variant of the topology 1 according to FIG. 1. In FIG. 4 the photovoltaic panel 2 according to FIG. 1 is not shown. The topology 1 according to FIG. 4 additionally comprises a DC/DC-converter 27 arranged between the switch 6 and the capacitors 9 and 10 connected in series between the bus lines 4 and 5. Further, FIG. 4 indicates that the power supply of the controller 7 is directly effected at the input side of the topology 1. That is, the controller 7 is supplied with electric energy by means of a DC-power source to which the topology 1 is connected. This ensures that the controller 7 is always working as soon as an input voltage is applied between the bus lines 4 and 5 at the input side of the topology 1. Further, the controller 7 may also be used to open the switch 6, if another failure than a failure of one of the capacitors 9 and 10 is detected, like for example a lack in symmetry of an intermediate circuit, a shortcut towards earth, a current exceeding a predetermined threshold and so on. According to FIG. 3, the switch 6 is no pulsed switch but an opening relay. The opening speed of the relay is increased by pre-magnetizing the relay solenoid. This is effected by a DC pre-magnetizing current which is activated as soon as the input voltage exceeds a lower threshold value. To the end of avoiding the formation of an electric arc between the contacts of the switch 6 upon opening, a transistor which is switched on during opening the relay or a capacitor may be connected in parallel to the relay.

Many variations and modifications may be made to the preferred embodiments of the disclosure without departing substantially from the spirit and principles of the disclosure. All such modifications and variations are intended to be included herein within the scope of the present disclosure, as defined by the following claims.

We claim:

1. A topology for surveying the integrity of a plurality of capacitors connected in series between a pair of bus lines designed and arranged to be connected to a DC-power source, the topology comprising:
   a plurality of resistors connected in series between the pair of bus lines, the plurality of resistors being connected in parallel to the plurality of capacitors; and
   a comparator comparing the electric potential of an intermediate point between two capacitors of the plurality of capacitors with the electric potential of an intermediate point between two resistors of the plurality of resistors, and providing a signal signaling a difference between these two electric potentials which indicates a loss of integrity of one capacitor of the plurality of capacitors, wherein the signal signals whether a difference between the two electric potentials exceeds a predetermined threshold value, and wherein voltages dropping over the capacitors on both sides of the intermediate point between the two capacitors of the plurality of capacitors are defined by means of further resistors connected in parallel to these capacitors, and wherein a ratio of resistances of these further resistors on both sides of the intermediate point between the two capacitors, and a ratio of resistances of the resistors of the plurality of resistors on both sides of the intermediate point between the two resistors of the plurality of resistors are equal.

2. The topology according to claim 1, wherein the capacitors on both sides of the intermediate point between the two capacitors of the plurality of capacitors are of equal total capacities, and the resistors of the plurality of resistors on both sides of the intermediate point between the two resistors of the plurality of resistors are of equal total resistances.

3. The topology according to claim 1, wherein the bus lines are leading to a DC/AC-inverter.

4. The topology according to claim 1, wherein the bus lines are leading to a DC/DC-converter.

5. The topology according to claim 1, wherein a DC-power source is selected from the group consisting of photo voltaic panels, electric generators, photovoltaic panels combined with DC/DC-converters, electric generators combined with DC/DC-converters and electric generators combined with AC/DC-inverters.

6. The topology according to claim 1, wherein that the signal operates a switch due to the difference in electric potential exceeding the threshold value.

7. The topology according to claim 6, wherein the switch is arranged in one of the bus lines at a point located from the capacitors and resistors towards the DC-power source.

8. The topology according to claim 6, wherein the switch is arranged in parallel to a resistor of a second plurality of resistors connected in series between the bus lines and in parallel to the capacitors, wherein a voltage limiter is arranged to limit a voltage drop over at least one of the second plurality of resistors, the voltage operating a pulsed switch arranged in one of the bus lines at a point located from the capacitors and resistors towards the DC-power source.

9. The topology according to claim 6, wherein the comparator comprises a LED connected to the intermediate points between the two capacitors of the plurality of capacitors and between the two resistors of the plurality of resistors via a current rectifier H-bridge, the LED being part of an optocoupler operating the switch.

10. The topology according to claim 6, wherein the comparator comprises a voltage meter which measures the difference in the electric potential between the two intermediate points between the two capacitors of the plurality of capacitors and between the two resistors of the plurality of resistors, and a controller which opens the switch.

11. The topology according to claim 10, wherein a further voltage meter is provided for measuring the voltage between the two bus lines, wherein the controller also opens the switch when the voltage between the two bus lines exceeds a predetermined voltage threshold value.

12. The topology according to claim 11, wherein the controller is powered by the DC-power source.

13. The topology according to claim 9, wherein the current rectifier H-bridge is made of four rectifying diodes.

14. The topology according to claim 9, wherein the LED is connected in series with a Zener-diode.

15. The topology according to claim 7, wherein a DC/DC-converter is provided between the switch and the plurality of capacitors and the plurality of the resistors.

16. A topology for surveying the integrity of a plurality of capacitors connected in series between a pair of bus lines designed and arranged to be connected to a DC-power source, the topology comprising:
a plurality of resistors connected in series between the pair of bus lines, the plurality of resistors being connected in parallel to the plurality of capacitors; and
a comparator comparing the electric potential of an intermediate point between two capacitors of the plurality of capacitors with the electric potential of an intermediate point between two resistors of the plurality of resistors, and providing a signal signaling a difference between these two electric potentials which indicates a loss of integrity of one capacitor of the plurality of capacitors, wherein the signal signals whether a difference between the two electric potentials exceeds a predetermined threshold value, wherein the signal operates a switch due to the difference in electric potential exceeding the threshold value, wherein the switch is arranged in one of the bus lines at a point located from the capacitors and resistors towards the DC power source, and wherein a DC/DC-converter is provided between the switch and the plurality of capacitors and the plurality of resistors.

17. The topology according to claim 16, wherein the capacitors on both sides of the intermediate point between the two capacitors of the plurality of capacitors are of equal total capacities, and the resistors of the plurality of resistors on both sides of the intermediate point between the two resistors of the plurality of resistors are of equal total resistances.

18. A topology for surveying the integrity of a plurality of capacitors connected in series between a pair of bus lines designed and arranged to be connected to a DC-power source, the topology comprising:
a plurality of resistors connected in series between the pair of bus lines, the plurality of resistors being connected in parallel to the plurality of capacitors;
a comparator comparing the electric potential of an intermediate point between two capacitors of the plurality of capacitors with the electric potential of an intermediate point between two resistors of the plurality of resistors, and providing a signal signaling a difference between these two electric potentials which indicates a loss of integrity of one capacitor of the plurality of capacitors;
a switch arranged in parallel to a resistor of a second plurality of resistors connected in series between the bus lines and in parallel to the capacitors; and
a voltage limiter arranged to limit a voltage drop over at least one of the second plurality of resistors.

19. The topology according to claim 18, wherein the signal signals whether a difference between the two electric potentials exceeds a predetermined threshold value.

20. The topology according to claim 19, wherein that the signal operates a switch due to the difference in electric potential exceeding the threshold value.

21. The topology according to claim 20, wherein the signal-operated a pulsed switch is arranged in one of the bus lines at a point located from the capacitors and resistors towards the DC-power source.

* * * * *